(12) United States Patent
Dumoulin

(10) Patent No.: US 7,307,420 B2
(45) Date of Patent: Dec. 11, 2007

(54) MRI METHOD FOR SIMULTANEOUS PHASE CONTRAST ANGIOGRAPHY AND INVASIVE DEVICE TRACKING

(75) Inventor: Charles Dumoulin, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 62 days.

(21) Appl. No.: 11/248,969

(22) Filed: Oct. 12, 2005

(65) Prior Publication Data

US 2007/0080686 A1 Apr. 12, 2007

(51) Int. Cl.
*G01V 3/00* (2006.01)
*G01R 33/20* (2006.01)
*A61B 5/055* (2006.01)

(52) U.S. Cl. .................. 324/309; 324/307; 600/420; 600/424; 600/410

(58) Field of Classification Search ............... 600/410, 600/420, 424, 425, 431; 324/309, 307
See application file for complete search history.

(56) References Cited

U.S. PATENT DOCUMENTS

| | | | |
|---|---|---|---|
| 4,800,889 A | 1/1989 | Dumoulin et al. | |
| 4,918,386 A | 4/1990 | Dumoulin et al. | |
| 5,307,808 A | 5/1994 | Dumoulin et al. | |
| 5,318,025 A | 6/1994 | Dumoulin et al. | |
| 5,353,795 A | 10/1994 | Souza et al. | |
| 5,572,219 A | 11/1996 | Silverstein et al. | |
| 6,198,282 B1 | 3/2001 | Dumoulin | |
| 6,289,233 B1 | 9/2001 | Dumoulin et al. | |
| 6,534,982 B1* | 3/2003 | Jakab | 324/318 |
| 6,687,530 B2 | 2/2004 | Dumoulin | |
| 6,879,160 B2* | 4/2005 | Jakab | 324/318 |
| 7,081,748 B2* | 7/2006 | Jakab | 324/302 |
| 2003/0107375 A1* | 6/2003 | McGee et al. | 324/307 |
| 2003/0184297 A1* | 10/2003 | Jakab | 324/318 |
| 2005/0146327 A1* | 7/2005 | Jakab | 324/302 |
| 2007/0080686 A1* | 4/2007 | Dumoulin | 324/309 |

* cited by examiner

*Primary Examiner*—Diego Gutierrez
*Assistant Examiner*—Tiffany A. Fetzner
(74) *Attorney, Agent, or Firm*—Jean K. Testa; Curtis B. Brueske

(57) ABSTRACT

A method for simultaneously tracking an invasive device disposed within a patient and acquiring an imaging signal of the patient with a magnetic resonance imaging (MRI) system during a single echo acquisition time period (46) of the MRI system. The method includes applying a radio frequency excitation pulse (26) to a patient to start an echo acquisition time period of an MRI system. The method then includes acquiring a tracking signal (54) from the invasive device during the echo acquisition time period and also acquiring an imaging signal (36) of the patient proximate an end of the same echo acquisition time period.

12 Claims, 4 Drawing Sheets

MRI METHOD FOR SIMULTANEOUS PHASE CONTRAST ANGIOGRAPHY AND INVASIVE DEVICE TRACKING

FIELD OF THE INVENTION

The present invention is generally related to magnetic resonance imaging (MRI), and, more particularly, to simultaneously tracking an invasive device while acquiring a phase contrast angiography image.

BACKGROUND OF THE INVENTION

It is known to use phase contrast angiography MRI techniques to provide magnetic resonance (MR) angiographic projection images indicating a flow of bodily fluids through various body passages for medical diagnostic purposes. Techniques such as phase contrast angiography provide projection images, for example, though an entire anatomical thickness of patient, and allow high quality magnetic resonance (MR) angiograms of arterial and venous structures to be obtained along one or more selected projection axes and with a selected direction of flow sensitivity. Typically, a bipolar gradient pulse is used to encode phase shifts due to velocity of imaged fluid flows It is also known to track an invasive device fitted with a radio frequency (RF) coil within a patient using MR signals that are excited within the entire patient. The excitations are detected by the coil of the invasive device to provide coil position, and, accordingly, device position information. The position information may be superimposed on an MR image of a region of interest or otherwise made available to an operator of the invasive device. Such MR tracking techniques may include the use of excitation multiplexing schemes, such as Hadamard modulation, to reduce a number of excitations needed to locate the device within the body of the patient. MR tracking may be performed relatively more rapidly than other MRI techniques over an entire three dimensional volume of the patient.

DETAILED DESCRIPTION OF THE INVENTION

Phase-contrast angiography is a known form of magnetic resonance imaging in which image contrast arises primarily from velocity of imaged anatomy. It is frequently used for blood vessel imaging and has the ability to provide quantitative measurements of blood velocity and direction. Phase-contrast angiography procedures may be used to acquire two-dimensional and/or three-dimensional MR angiograms.

Figure 1:
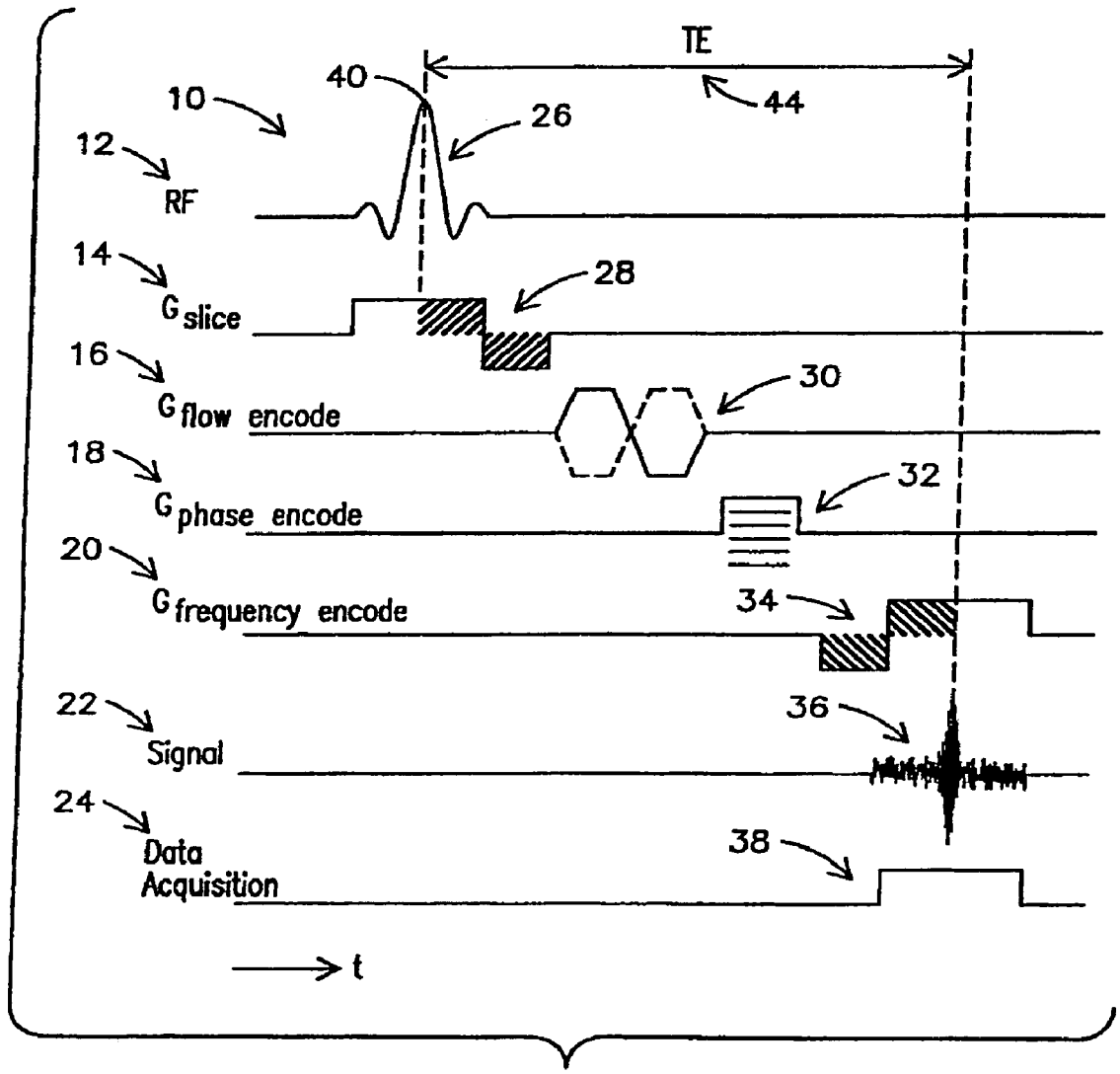
FIG. 1 shows a prior art timing diagram for phase contrast angiography using MR techniques.

FIG. 1 shows a prior art two-dimensional phase-contrast MR angiography pulse sequence timing diagram 10. The timing diagram includes timing representations of an RF signal 12, a slice encoding gradient 14, a flow encoding gradient 16, a phase encoding gradient 18, a frequency encoding gradient 20, an excited signal 22, and a data acquisition gate 24. As well understood, the gradient axes that are used during imaging determine the geometry of an acquired image. For example, a full projective coronal MR angiogram may be obtained with the following axial assignments for gradient encoding representations $G_{slice}$ 14, $G_{flow\ encode}$ 16, $G_{phase\ encode}$ 18, and $G_{frequency\ encode}$ 20:

| | |
|---|---|
| $G_{slice}$ 14 | Z axis (i.e. axial slice) |
| $G_{flow\ encode}$ 16 | X, Y and Z axes (for example, using known multiplexing schemes) |
| $G_{phase\ encode}$ 18 | Z axis |
| $G_{frequency\ encode}$ 20 | X axis |

The pulse sequence of the timing diagram 10 begins with an RF excitation pulse 26 that is applied in the presence of a magnetic field gradient pulse 28. In typical MR imaging sequences, the combination of the RF pulse's bandwidth and the strength of the gradient generated by the magnetic field gradient pulse 28 is chosen to limit the excitation volume of an imaged patient. In conventional MR imaging this volume is limited to a relatively thin slice such as less than 1 cm. In projective MR angiography and three-dimensional MR imaging, this volume is larger and can encompass a substantial portion of the selected patient anatomy.

After transverse magnetization has been created with the RF pulse 26, a bipolar flow-encoding gradient pulse 30 is applied. This bipolar pulse 30 creates a phase shift in the transverse magnetization that is proportional to velocity. The bipolar flow-encoding gradient pulse 30 is followed by a phase encoding pulse 32 of the phase encoding signal 18 and a frequency encoding pulse 34 for image formation. An imaging signal 36 responsive to the RF excitation pulse 26 and gradient pulses 28, 30, 32, 34 is detected during the data acquisition pulse 38. The peak of the detected imaging signal 36 occurs at a time echo period 44. The time echo period 44 is typically measured from a time of a peak amplitude 40 of the RF pulse 26 to a point in time during the frequency encoding pulse 34 at which the area of a first portion of frequency encoding pulse 34 is balanced by a second portion of frequency encoding pulse 34 as illustrated by the cross-hatched portions of frequency encoding pulse 34 in FIG. 1.

To selectively detect moving material such as blood, the sequence is repeated for respective time echo periods 44 with all pulses 28, 32, and 34 having identical amplitudes except for the flow-encoding pulse 30. Known modulation schemes may be used to reduce the number of excitations required. One of the simplest schemes inverts the polarity of the bipolar flow-encoding gradient pulse 30. Data acquired with positive flow-encoding is subtracted from the data acquired with negative flow-encoding to remove all information except for that arising from spins moving in the direction of the applied bipolar flow-encoding gradient pulse 30. With the simple modulation scheme, full sensitivity to flow can be obtained by repeating the two-step modulation with bipolar flow-encoding gradient pulse 30 applied in an x, then y, and finally z directions (for a total of six excitations). Four-step modulation schemes based upon known Hadamard encoding and simple reference encoding may also be used.

Invasive devices fitted with an RF coil and used during a medical procedure have been tracked in patients using MR techniques. When performing an interventional medical procedure being monitored using MRI, such as during MR angiography, it is important to provide a real-time representation of the invasive device being manipulated within the patient with respect to a reference image that accurately represents the patient's anatomy. This has proven difficult to achieve in practice because of patient motion and/or changes in anatomy or function resulting from the intervention. Typically, an MRI process, such as phase contrast angiography, and an MRI tracking process are performed separately, which may result in an undesirably long time delay between acquiring an image of the patient and then providing an indication indicative of a position of the invasive device with respect to the acquired image. The inventors of the present invention have innovatively realized that by simultaneously acquiring a phase contrast angiogram and MR tracking data for an invasive device during the same acquisition period, real time tracking information of an invasive device may be provided.

In an aspect of the invention, a method for simultaneously tracking an invasive device disposed within a patient and acquiring an imaging signal of the patient with a magnetic resonance imaging (MRI) system during a single excitation period of the MRI system may include applying an RF excitation pulse to a patient to start an echo acquisition time period of an MRI system. After applying the RF excitation pulse, the method includes acquiring a tracking signal from the invasive device during the echo acquisition time period. The method further includes acquiring an imaging signal of the patient proximate an end of the same echo acquisition time period so that the tracking signal and the imaging signal are performed within a single echo acquisition time period.

Figure 2:
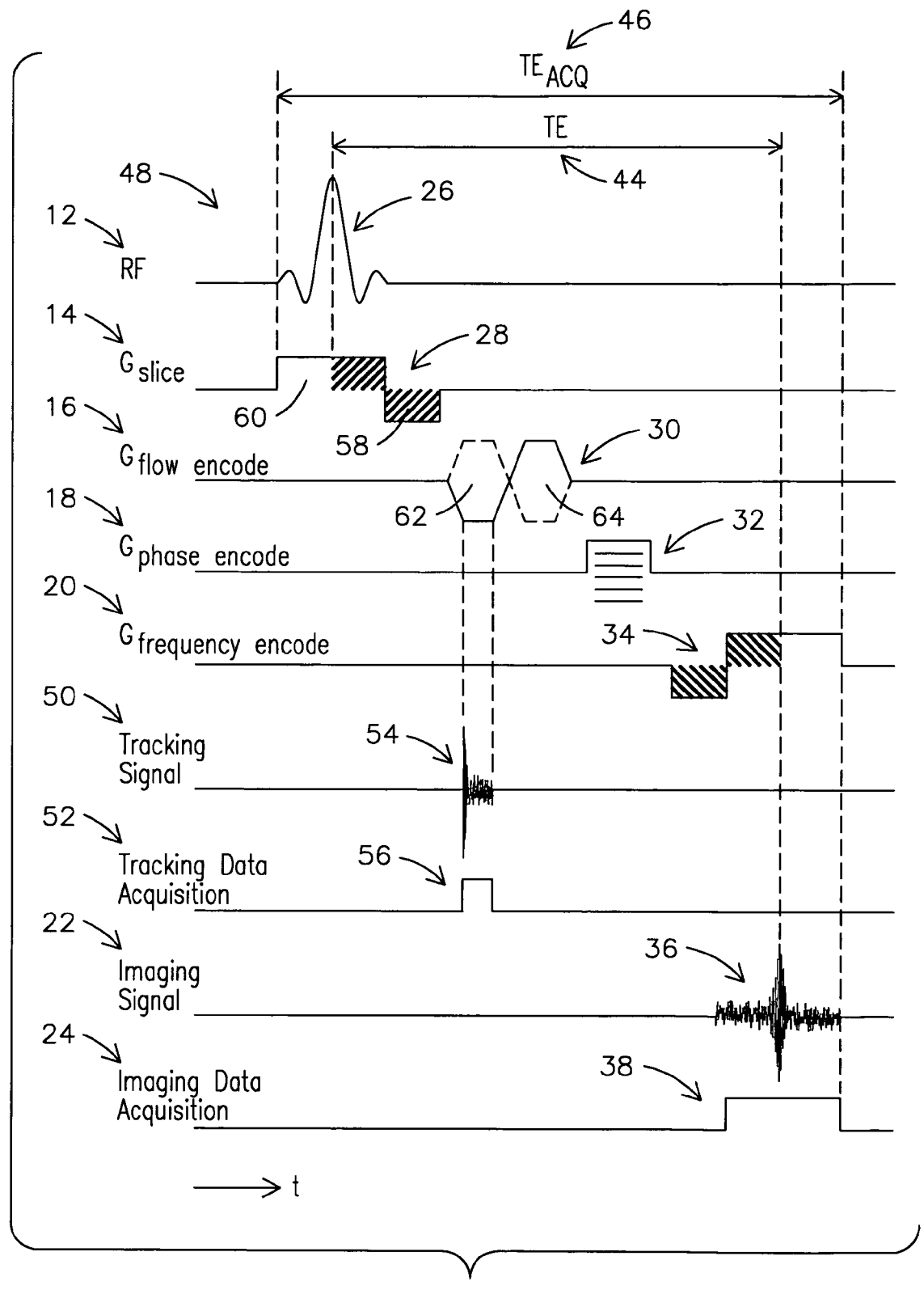
FIG. 2 shows an exemplary timing diagram for simultaneously tracking an invasive device while acquiring a two-dimensional phase contrast angiography image.

FIG. 2 shows an exemplary timing diagram 48 for simultaneously tracking an invasive device while acquiring a phase contrast angiography image during a single echo acquisition time period. The timing diagram represents pulse sequences that may be used in an excitation of the MRI system during a time echo acquisition period 46. The time echo acquisition period 46 for acquiring a single imaging signal 36 may extend from a time of application of the RF pulse 26 to a time at an end of the data acquisition pulse 38. The pulse sequences shown in the timing diagram 48 may use an RF excitation pulse 26 that excites a relatively large portion of a patient immersed in a main static magnetic field of an MRI system. If desired, the pulse sequences used may be non-selective, i.e., no magnetic field gradient pulse 28 applied, or they may be weakly selective i.e., by applying a desired magnetic field gradient pulse 28.

A shape of the RF pulse 26 waveform may be symmetric and include a sin (x)/x shape to provide a square frequency response. The RF pulse 26 may be applied in the presence of magnetic field gradient pulse 28 to limit region of the patient that has a Larmor frequency that matches the frequencies within the excitation bandwidth of the RF pulse 26. The magnetic field gradient pulse 28 may include a refocusing portion 58 with a polarity opposite that of a first portion 60. For the symmetric RF pulse 26 shown, an area of the refocusing portion 58 of the magnetic field gradient pulse 28 may be chosen to be half an area of the first portion 60, as indicated by the cross-hatching. If desired, asymmetric shaped RF pulses may be used for more rapid excitation.

At some time after the magnetic field gradient pulse 28 is applied, a bipolar flow encoding magnetic field gradient pulse 30 is applied. This bipolar pulse 30 induces a phase shift that is proportional to velocity in the excited spin magnetization, as is well-known for phase-contrast MR angiography. The bipolar pulse 30 may include a first portion 62 and a second portion 64 having a polarity opposite from the first portion 62. Unlike conventional MR angiography, a tracking signal 54 present on a monitored tracking signal line 50 generated by an invasive device disposed within the patient and responsive to the bipolar flow encoding magnetic field gradient pulse 30 is acquired during the application of one or both of the portions 62, 64 of the bipolar pulse 30. Acquisition of the tracking signal 54 may be commanded by a tracking data acquisition pulse 56 asserted on a tracking data acquisition line 52. Data corresponding to the tracking signal 54 may be acquired from one or more miniature RF pickup coils that are incorporated into one or more MR tracked invasive devices.

After the bipolar flow encoding magnetic field gradient pulse 30 is applied, imaging gradient pulses, such as phase encoding 32 and frequency encoding 34 pulses are applied and imaging data is acquired on an imaging signal line 22, such as near the end of the time echo acquisition period 46. Acquisition of the imaging signal 36 may be controlled by assertion of an imaging data acquisition pulse 38. Although the pulse sequence shows the phase encoding 32 and frequency encoding 34 pulses occurring at different times, it is possible to overlap these pulses 32, 34 in time. Furthermore, it may be possible and advantageous to combine and/or overlap other pulses in the sequence to minimize a pulse sequence duration. For example, the refocusing portion 58 of the magnetic field gradient pulse 28 may be combined with the first portion 62 of bipolar pulse 30 to form a composite pulse of shorter duration, while still imparting substantially the same phase shifts to the imaging signal 36.

The pulse sequence shown in FIG. 2 may be repeated N times (where N is the number of excitations) using different values for the bipolar pluse 30 for each repetition. Modulation schemes such as those shown in Tables 1-4 below may be used to reduce a number of excitations required to achieve desired imaging information:

TABLE 1

N = 2, simple modulation of one selected gradient

| Excitation | X | Y | Gradient Axis Z |
|---|---|---|---|
| 1 | − | 0 | 0 |
| 2 | + | 0 | 0 |

TABLE 2

N = 4, Hadamard modulation of gradient polarities

| Excitation | X | Y | Gradient Axis Z |
|---|---|---|---|
| 1 | − | − | − |
| 2 | + | + | − |
| 3 | + | − | + |
| 4 | − | + | + |

TABLE 3

N = 4, simple modulation of gradient polarities

| Excitation | X | Y | Gradient Axis Z |
|---|---|---|---|
| 1 | 0 | 0 | 0 |
| 2 | + | 0 | 0 |
| 3 | 0 | + | 0 |
| 4 | 0 | 0 | + |

TABLE 4

N = 6, simple modulation of all gradients

| Excitation | X | Y | Gradient Axis Z |
|---|---|---|---|
| 1 | − | 0 | 0 |
| 2 | + | 0 | 0 |
| 3 | 0 | − | 0 |
| 4 | 0 | + | 0 |
| 5 | 0 | 0 | − |
| 6 | 0 | 0 | + |

The modulation schemes shown in Tables 1-4 modulate the phase of the transverse spin magnetization created by the RF pulse 26. Useful information about the location of flowing blood and tracking coils may be extracted from respective data sets corresponding to received signals 36, 54 using appropriate de-multiplexing techniques. For example, a simple N=2 modulation scheme as shown in Table 1 may be de-multiplexed by subtracting signal data acquired in a first excitation from signal data acquired in a second excitation.

After a set of N excitations has been performed, there is sufficient data to compute the location of the MR tracking coils of the invasive device. These locations may be provided to various MRI system components for a variety of uses. For example, the locations can be used to control the placement of icons on a computer screen of the MRI systems to indicate the device location to the user.

However, after N excitations, there may not be enough data to reconstruct an image. Consequently, additional excitations may need to be performed, for example, with different amplitude phase-encoding pulses 32 for each excitation, to complete an image data set necessary for creating an image. Once a sufficient number, M, of additional image acquisition, or phase encoding, excitations (typically between 64 and 512), have been performed, a two-dimensional Fourier transform may be performed on the imaging signal data acquired to obtain an image, as is well understood in the art.

In an embodiment of the invention, the steps of tracking and imaging may be performed continuously. Once a sufficient number, M, of phase-encoding excitations are performed, an image is obtained and the process repeated as required to obtain new tracking data and imaging data. Since only N excitations are necessary to obtain tracking data and N being less than M, the location of the tracking coils of the invasive device may be determined one or more times for each phase-encoding set of excitations M. Also, once one full image has been obtained, continuous image reconstruction can be performed by repeating one or more subsequent sets of excitations while asynchronously reconstructing images using only the M most recently acquired data sets. An MRI system operating in this mode is capable of simultaneously providing three-dimensional location information for one or more invasive devices and a continuously updated MR angiogram of the patient.

Figure 3:
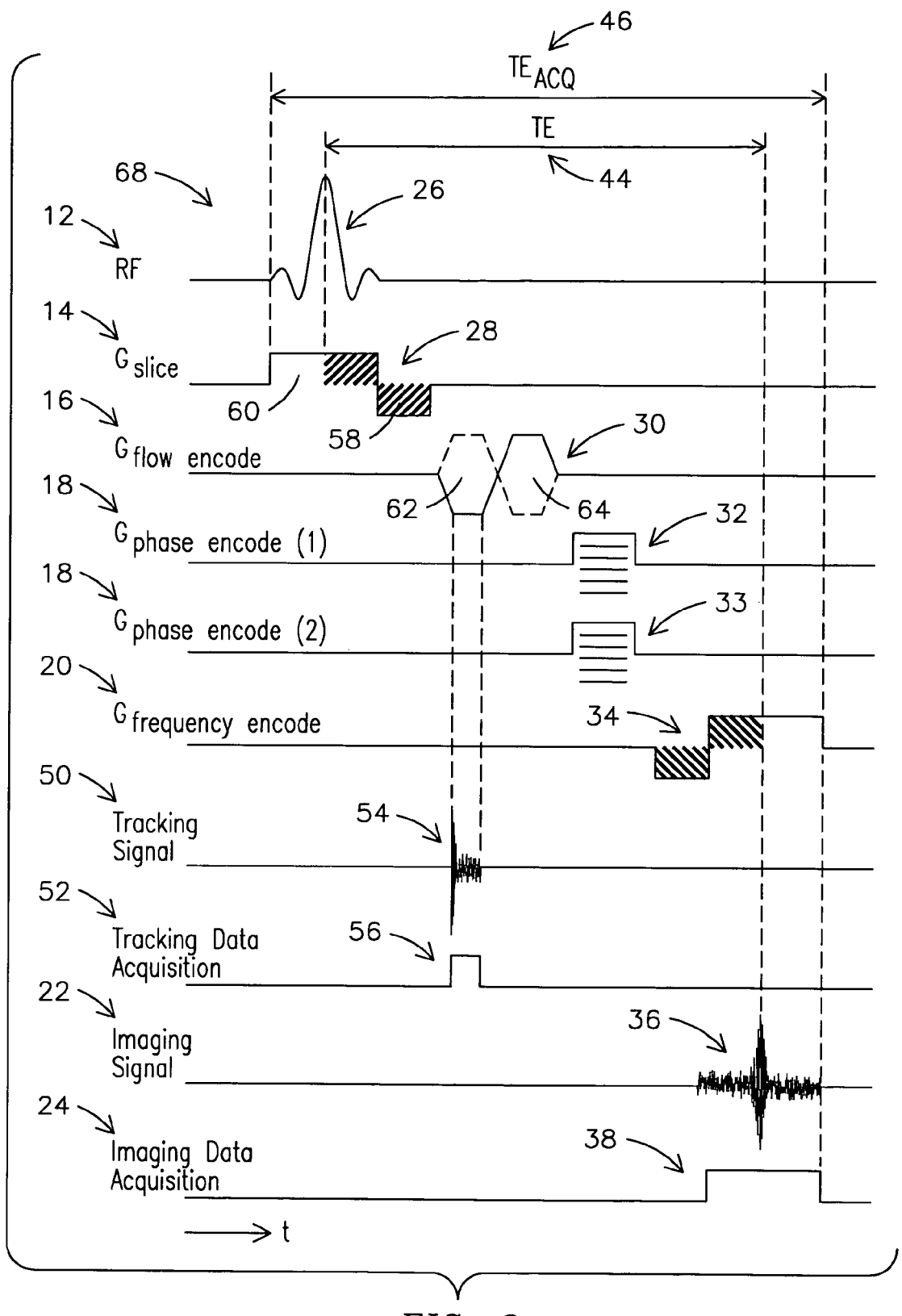
FIG. 3 shows another exemplary timing diagram for simultaneously tracking an invasive device while acquiring a three-dimensional phase contrast angiography image.
Figure 4:
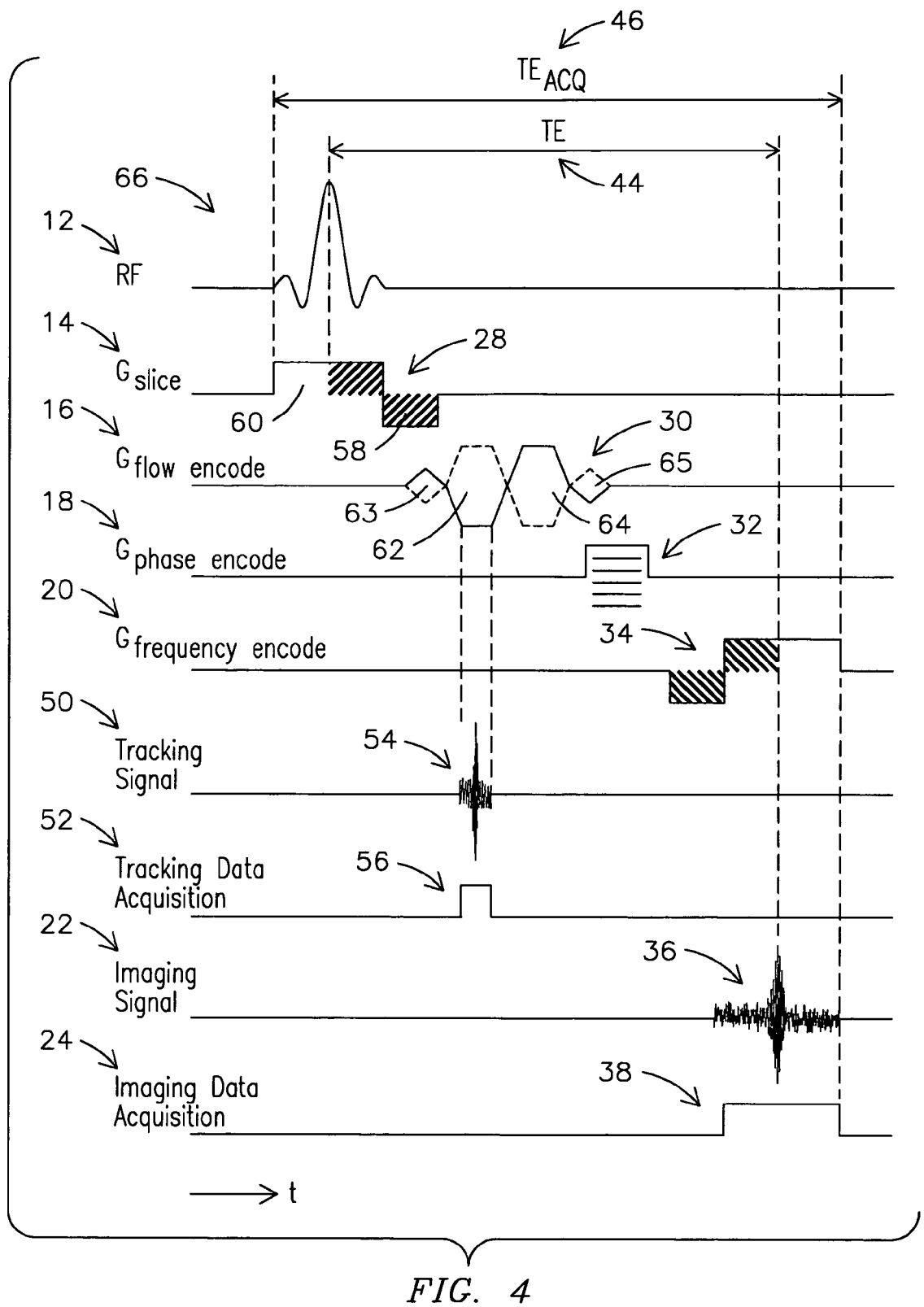
FIG. 4 shows another exemplary timing diagram for simultaneously tracking an invasive device while acquiring a two-dimensional phase contrast angiography image.

FIG. 3 shows a second exemplary timing diagram 68 for simultaneously tracking an invasive device while acquiring a phase contrast angiography image. In this implementation, two phase-encoding pulses 32, 33 may be used to provide a three-dimensional phase-contrast angiogram in a fashion well known to those skilled in the art. FIG. 4 shows a third exemplary timing diagram 66 for simultaneously tracking an invasive device while acquiring a phase contrast angiography image. In this embodiment, relatively smaller de-phasing gradient lobe 63, and re-phasing gradient lobe 65 are included on either side of the bipolar flow-encoding pulse 30, thereby resulting in a shift of the tracking signal relative to the bipolar pulse 30 compared to a position of the tracking signal relative to a bipolar pulse 30 without lobes 63, 65. A preceding de-phasing lobe 63 may include a polarity opposite from a polarity of the first portion 62 of the bipolar pulse 30; and a following re-phasing pulse 65 may include a polarity opposite from a polarity of the second portion 64 of the bipolar pulse 30. The preceding de-phasing lobe 63 and the following re-phasing pulse 65 are believed to increase the signal-to-noise ratio (SNR) of the tracking signal 54 by shifting undesired MR tracking signals, which have a short time duration, outside the tracking data acquisition window with limited effect on the imaging signal 36. If desired, the amplitudes of de-phasing lobe 63 and re-phasing lobe 65 can be chosen to minimize phase shifts in an imaging signal 36 arising from acceleration without detriment to tracking signal 54.

Based on the foregoing specification, the invention may be implemented using computer programming or engineering techniques including computer software, firmware, hardware or any combination or subset thereof, wherein the technical effect is to perform simultaneously tracking of an invasive device while acquiring a phase contrast angiography image. Any such resulting program, having computer-readable code means, may be embodied or provided within one or more computer-readable media, thereby making a computer program product, i.e., an article of manufacture, according to the invention. The computer readable media may be, for instance, a fixed (hard) drive, diskette, optical disk, magnetic tape, semiconductor memory such as read-only memory (ROM), etc., or any transmitting/receiving medium such as the Internet or other communication network or link. The article of manufacture containing the computer code may be made and/or used by executing the code directly from one medium, by copying the code from one medium to another medium, or by transmitting the code over a network.

One skilled in the art of computer science will easily be able to combine the software created as described with appropriate general purpose or special purpose computer hardware, such as a microprocessor, to create a computer system or computer sub-system embodying the method of the invention. An apparatus for making, using or selling the invention may be one or more processing systems including, but not limited to, a central processing unit (CPU), memory, storage devices, communication links and devices, servers, I/O devices, or any sub-components of one or more processing systems, including software, firmware, hardware or any combination or subset thereof, which embody the invention.

While the preferred embodiments of the present invention have been shown and described herein, it will be obvious that such embodiments are provided by way of example only. Numerous variations, changes and substitutions will occur to those of skill in the art without departing from the invention herein. For example, many other modulation schemes may be used to simultaneously encode MR tracking data and MR imaging data. Likewise, other MR image formation methods such as spiral imaging, echo-planar imaging, Fast spin-echo imaging, projection reconstruction imaging, and parallel imaging using multiple receive coils may be used to simultaneously encode MR imaging data and MR tracking data. Accordingly, it is intended that the invention be limited only by the spirit and scope of the appended claims.

What is claimed is:

1. A method for use with a magnetic resonance imaging system (MRI) for simultaneously tracking an invasive device disposed within a patient and acquiring an imaging signal of the patient during a single echo acquisition time period of the MRI system, the method comprising:
   (a) immersing the patient in a main static magnetic field;
   (b) applying, at a start of a first echo acquisition time period, a radio frequency excitation pulse while applying a slice selection magnetic field gradient pulse;
   (c) applying a bipolar flow encoding magnetic field gradient pulse having a first portion and a second portion having a polarity opposite the first portion;
   (d) acquiring a tracking signal generated by an invasive device disposed within the patient, the tracking signal being responsive to the bipolar flow encoding magnetic field gradient pulse;
   (e) applying at least one imaging magnetic field gradient pulse;
   (f) acquiring, at an end of the first echo acquisition time period, an imaging signal responsive to the at least one imaging magnetic field gradient pulse so that acquisition of the tracking signal and the imaging signal are performed within a single echo acquisition time period; and
   (g) simultaneously tracking the invasive device while acquiring and producing a phase contrast angiography image, during the single echo acquisition time period.

2. The method of claim 1, further comprising repeating steps (b)-(f) at least one more time during a second echo acquisition time period while applying a different bipolar flow encoding magnetic field gradient pulse for each repetition to provide modulated tracking signal data.

3. The method of claim 2, wherein the different bipolar flow encoding magnetic field gradient pulse comprises a different polarity than the bipolar flow encoding magnetic field gradient pulse applied during the first echo acquisition period.

4. The method of claim 2, wherein the modulated tracking signal data is modulated using a Hadamard multiplexing scheme.

5. The method of claim 1, wherein applying the at least one imaging magnetic field gradient pulse comprises:
   applying a first phase encoding pulse; and
   applying a frequency encoding pulse.

6. The method of claim 5, further comprising applying a second phase encoding pulse simultaneously with the first phase encoding pulse.

7. The method of claim 1, wherein the bipolar flow encoding magnetic field gradient pulse further comprises:
   a preceding de-phasing lobe having a polarity opposite from a polarity of the first portion of the bipolar pulse; and
   a following re-phasing lobe having a polarity opposite from a polarity of the second portion of the bipolar pulse.

8. The method of claim 1, further comprising acquiring the tracking signal simultaneously with application of the first portion of the bipolar flow encoding magnetic field gradient pulse.

9. The method of claim 1, further comprising repeating steps (b)-(f) while reconstructing images asynchronously with respect to acquisition of the imaging signals.

10. The method of claim 1, wherein steps (b)-(f) are performed according to a spiral imaging technique, an echo-planar imaging technique, a fast spin-echo imaging technique, a projection reconstruction imaging technique, or a parallel imaging technique.

11. A method for simultaneously tracking an invasive device disposed within a patient and acquiring an imaging signal of the patient with a magnetic resonance imaging (MRI) system during a single echo acquisition time period of the MRI system comprising:
   applying a radio frequency excitation pulse to a patient to start an echo acquisition time period of an MRI system;
   acquiring a tracking signal from the invasive device during the echo acquisition time period;
   acquiring an imaging signal of the patient proximate an end of the same echo acquisition time period; and
   simultaneously tracking the invasive device while acquiring and producing a phase contrast angiography image, during the same echo acquisition time period.

12. A computer readable medium storing computer instructions for instructing a computer system and enabling simultaneously the tracking of an invasive device disposed within a patient and acquiring an imaging signal of the patient with a magnetic resonance imaging (MRI) system during a single echo acquisition time period of the MRI system, the computer readable media comprising:
   a computer program code operative with an MRI system enabling the applying of a radio frequency excitation pulse to a patient to start an echo acquisition time period of an MRI system;
   a computer program code operative with an MRI system enabling the acquiring of a tracking signal from the invasive device during the echo acquisition time period; and
   a computer program code operative with an MRI system enabling the acquiring of an imaging signal of the patient proximate an end of the same echo acquisition time period; and
   a computer program code operative with the MRI system enabling simultaneously the tracking of the invasive device while acquiring and producing a phase contrast angiography image, during the same echo acquisition time period and further superimposing an image of the invasive device on the phase contrast angiography image that is utilized upon an image display.

* * * * *